United States Patent
Kung et al.

(10) Patent No.: US 11,271,103 B2
(45) Date of Patent: Mar. 8, 2022

(54) SEMICONDUCTOR DEVICE AND MANUFACTURING PROCESS THEREOF

(71) Applicant: TAIWAN SEMICONDUCTOR MANUFACTURING COMPANY LTD., Hsinchu (TW)

(72) Inventors: Pohan Kung, Tainan (TW); Ying-Jing Lu, Kaohsiung County (TW); Chi-Cheng Hung, Tainan (TW); Yu-Sheng Wang, Tainan (TW); Shiu-Ko Jangjian, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/027,549

(22) Filed: Sep. 21, 2020

(65) Prior Publication Data
US 2021/0005743 A1    Jan. 7, 2021

Related U.S. Application Data

(62) Division of application No. 14/658,649, filed on Mar. 16, 2015, now abandoned.

(51) Int. Cl.
| | |
|---|---|
| *H01L 27/088* | (2006.01) |
| *H01L 29/78* | (2006.01) |
| *H01L 21/768* | (2006.01) |
| *H01L 23/532* | (2006.01) |

(52) U.S. Cl.
CPC ........ *H01L 29/78* (2013.01); *H01L 21/76834* (2013.01); *H01L 21/76849* (2013.01); *H01L 21/76855* (2013.01); *H01L 21/76889* (2013.01); *H01L 23/53223* (2013.01); *H01L 23/53238* (2013.01)

(58) Field of Classification Search
CPC ......... H01L 21/76849; H01L 21/76834; H01L 21/76855; H01L 21/76889; H01L 23/53223; H01L 23/53238; H01L 29/78
See application file for complete search history.

(56) References Cited

U.S. PATENT DOCUMENTS

| | | | | |
|---|---|---|---|---|
| 5,763,321 | A * | 6/1998 | Ohshima | H01L 21/76879 438/618 |
| 6,268,289 | B1 * | 7/2001 | Chowdhury | H01L 21/2885 257/E21.175 |
| 6,339,025 | B1 * | 1/2002 | Liu | H01L 21/3185 438/687 |

(Continued)

*Primary Examiner* — Jay C Kim
(74) *Attorney, Agent, or Firm* — WPAT, P.C., Intellectual Property Attorneys; Anthony King

(57) ABSTRACT

A method of manufacturing a semiconductor device includes: providing a substrate; forming a gate structure on the substrate; depositing a first dielectric layer over the gate structure; depositing a conductive interconnect in a trench of the first dielectric layer thereby exposing a surface of the conductive interconnect through the first dielectric layer; depositing a conductive layer over the exposed surface of the conductive interconnect; depositing a silicon-containing layer over the conductive layer and the conductive interconnect; and forming a metal silicide layer to be a silicide form of the conductive layer by reacting the conductive layer with silicon in the silicon-containing layer.

20 Claims, 15 Drawing Sheets

(56) References Cited

U.S. PATENT DOCUMENTS

| | | | | |
|---|---|---|---|---|
| 6,432,822 B1* | 8/2002 | Ngo | H01L 21/76834 | 257/E21.576 |
| 6,638,775 B1* | 10/2003 | Kweon | H01L 21/28518 | 257/E21.011 |
| 6,787,480 B2* | 9/2004 | Aoki | H01L 21/3185 | 438/775 |
| 6,806,191 B2* | 10/2004 | Zistl | H01L 21/76867 | 257/E21.311 |
| 6,977,218 B2* | 12/2005 | Yu | H01L 21/76849 | 438/628 |
| 7,179,737 B2* | 2/2007 | Nishida | H01L 27/0688 | 438/649 |
| 7,268,073 B2* | 9/2007 | Ramappa | H01L 21/7684 | 257/E21.17 |
| 7,514,353 B2* | 4/2009 | Weidman | B82Y 30/00 | 257/E21.575 |
| 7,576,006 B1* | 8/2009 | Yu | H01L 21/76834 | 438/687 |
| 8,017,519 B2* | 9/2011 | Ishikawa | H01L 21/76834 | 438/655 |
| 8,143,162 B2* | 3/2012 | Yu | H01L 23/53238 | 438/687 |
| 8,461,683 B2* | 6/2013 | Yoo | H01L 23/485 | 257/751 |
| 8,927,416 B2* | 1/2015 | Harada | H01L 23/53295 | 438/637 |
| 9,153,500 B2* | 10/2015 | Sun | H01L 21/76843 | |
| 2007/0194450 A1* | 8/2007 | Tyberg | H01L 23/53271 | 257/751 |
| 2009/0017621 A1* | 1/2009 | Sako | H01L 21/67161 | 438/674 |
| 2010/0026866 A1* | 2/2010 | Matsumoto | H04N 5/378 | 348/308 |

* cited by examiner

SEMICONDUCTOR DEVICE AND MANUFACTURING PROCESS THEREOF

PRIORITY CLAIM AND CROSS-REFERENCE

This application is a divisional application of and claims priority to U.S. patent application Ser. No. 14/658,649 filed 16 Mar. 2015, the disclosure of which is hereby incorporated by reference in its entirety.

BACKGROUND

As the semiconductor manufacturing and fabrication industry has progressed to advanced technology nodes, it can be found that integration levels are increasing, device features are reduced, and greater demands are increasing for device performance.

In a fabrication process for a semiconductor chip, conductive interconnect structures are widely utilized for electrically connect different components of the device and/or connect external circuits. The requirements for reliability and performance of the conductive interconnects are becoming more stringent as the feature size continues to shrink. Advanced manufacturing techniques are investigated for improving the integrity of the conductive interconnects and the system performance of the semiconductor chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
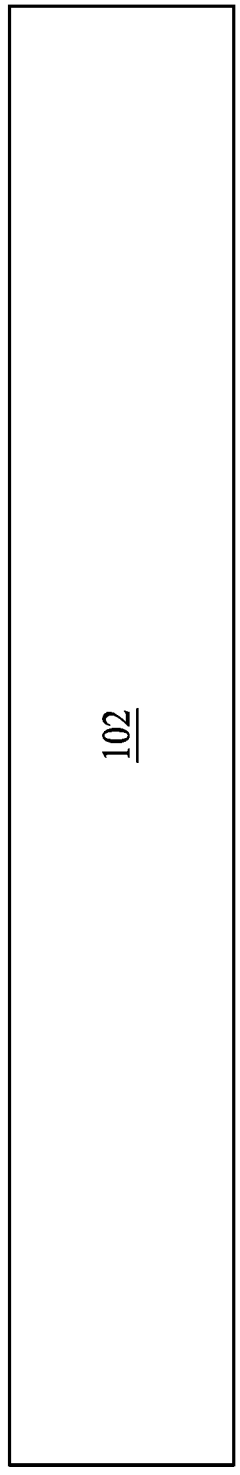
FIGS. 1A-1L are cross sectional views of operations for manufacturing a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1L are cross sectional views of operations for manufacturing a semiconductor device 100, in accordance with some embodiments of the present disclosure. Referring to FIG. 1A, a semiconductor substrate 102 is provided. Semiconductor substrate 102 includes a semiconductor material such as silicon, silicon germanium, or the like. Semiconductor substrate 102 may be lightly doped with a p-type impurity to become a p-type silicon substrate (P-substrate). Otherwise, semiconductor substrate 102 can also be doped with an n-type impurity to be an n-type silicon substrate (n-substrate). In some embodiments, semiconductor substrate 102 includes an elementary semiconductor such as silicon or germanium in crystal, polycrystalline, or an amorphous structure. In some embodiments, semiconductor substrate 102 may be compound semiconductor such as gallium arsenide (GaAs), gallium phosphide (GaP), silicon carbide (SiC), indium phosphide (InP), indium arsenide (InAs), or indium antimonide (InSb). In other embodiment, semiconductor substrate 102 may be an alloy semiconductor such as silicon germanium (SiGe), gallium arsenide phosphide (GaAsP), aluminium gallium arsenide (AlGaAs), aluminium indium arsenide (AlInAs), germanium indium arsenide (GaInAs), germanium indium phosphide (GaInP), and/or germanium indium arsenide phosphide (GaInAsP) or any other suitable materials.

In some embodiments, semiconductor substrate 102 may be a silicon on insulator (SOI) substrate. SOI substrates are fabricated using separation by implantation of oxygen (SIMOX), wafer bonding, and/or other suitable methods. In some examples, semiconductor substrate 102 includes a doped epitaxy layer or a buried layer. In other examples, semiconductor substrate 102 has a multilayer compound structure.

Figure 1B:
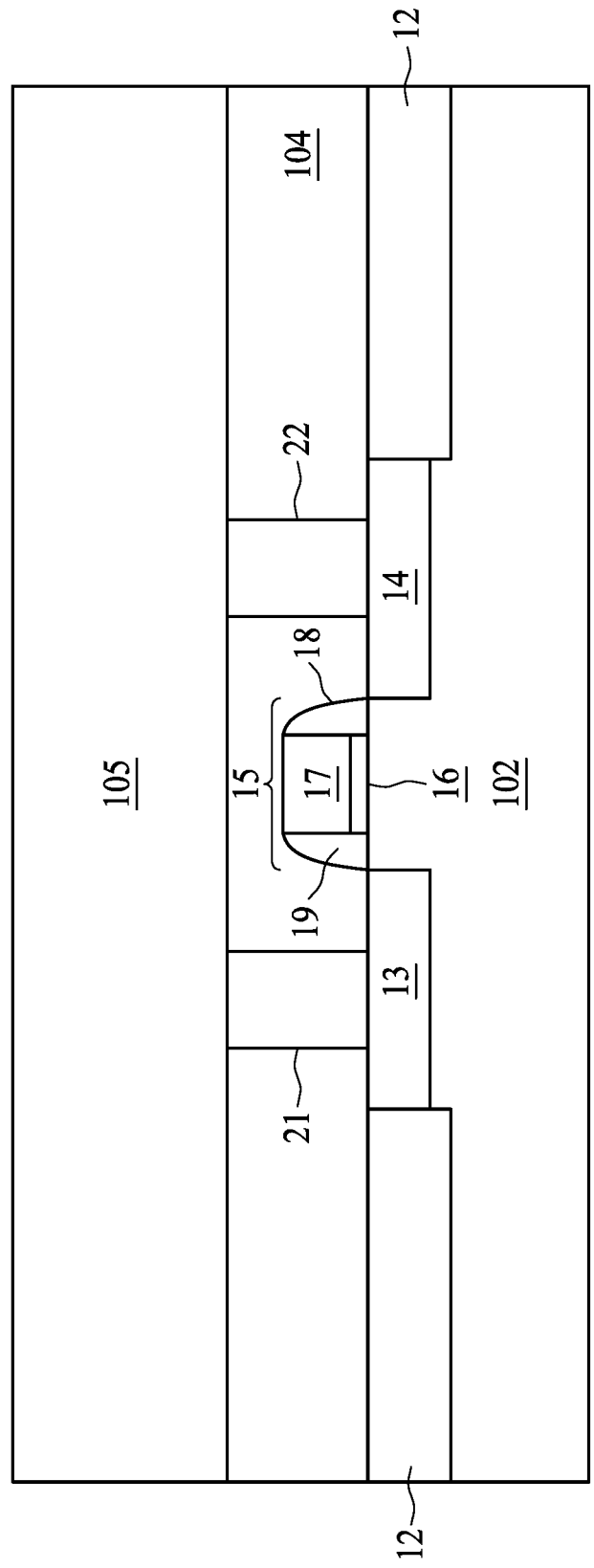

In FIG. 1B, various isolation features 12, such as shallow trench isolation (STI) or local oxidation of silicon (LOCOS), are formed in semiconductor substrate 102 to separate devices. Isolation features 12 are formed to define and electrically isolate various active regions as shown in FIG. 1. For example, isolation features 12 may define a region for a complementary metal oxide semiconductor (CMOS) device, a region for a core n-type MOS (NMOS) device, a region for a core p-type MOS (PMOS) device, and other regions for various microelectronic devices utilized in integrated circuits. It is understood that several processes disclosed below form corresponding features in some other active regions on semiconductor substrate 102 for some other types of devices. Isolation features 12 may comprise silicon oxide (SiOx), silicon nitride (SiN), silicon oxynitride (SiON), an air gap, other suitable materials, or combinations thereof.

Subsequently, a first doped region 13 is formed in semiconductor substrate 12 Moreover, a second doped region 14 is formed in semiconductor substrate 12 adjacent to some isolation features 12. First doped region 13 and second doped region 14 can be a source region or a drain region for PMOS, NMOS or CMOS transistors. First doped region 13 and second doped region 14 comprise highly concentrated dopants, and are formed as p-type regions with boron or n-type region with phosphorus. First doped region 13 and second doped region 14 may be formed by various processes, for example, thermal diffusion process. First doped region 13 and second doped region 14 may be formed by a plurality of operations, whether now known or to be developed, such as growing a sacrificial oxide on semiconductor substrate 102, opening a pattern for a location(s) in first doped region 13 or second doped region 14, implanting impurities and annealing.

In some embodiments, semiconductor substrate 102 may include various well regions (not shown) depending on design specifications as known in the art. The well regions are formed in a p-well structure, an n-well structure or a twin well structure. The doping concentration in those well regions is less than first doped region 13 or second doped region 14. The p-well structure is formed with p-type dopants to surround n-type first doped region 13 or n-type second doped region 14. Alternatively, the n-well structure is formed with n-type dopants to surround p-type first region 13 or second doped region 14.

In FIG. 1B, an inter-layer dielectric (ILD) layer 104 is formed on semiconductor substrate 102. ILD layer 104 includes parts of MOS transistors, such as a gate structure 15, first sidewall spacer 18, and second sidewall spacer 19 and conductive plugs 21 and 22.

Gate structure 15 is disposed on semiconductor substrate 102. Gate structure 15 may include a gate dielectric 16 disposed on semiconductor substrate 102 and a gate electrode 17 disposed on gate dielectric 16.

Gate dielectric 16, which is a layer on semiconductor substrate 102, may include a silicon oxide layer. Alternatively, gate dielectric 16 may optionally include a high-k dielectric material, silicon oxide, silicon nitride, silicon oxynitride, other suitable materials, or combinations thereof. The high-k material may be selected from metal oxides, metal nitrides, metal silicates, transition metal-oxides, transition metal-nitrides, transition metal-silicates, oxynitride of metals, metal aluminates, zirconium silicate, zirconium aluminate, hafnium oxide, or combinations thereof. Examples of high-k dielectric material includes $HfO_2$, HfSiO, HfSiON, HfzrO, LaO, BazrO, HfLaO, HfSiO, LaSiO, AlSiO, HfTaO, HfTiO, zirconium oxide, aluminum oxide, other suitable high-k dielectric materials, and/or combinations thereof. In some embodiments, gate dielectric 16 may have a multilayer structure such as one layer of silicon oxide and another layer of high k material. Gate dielectric 16 may be formed over an interfacial layer by any suitable process.

Gate electrode 17 is disposed on gate dielectric 16. Gate electrode 17 includes conductive material, such as aluminum, copper, titanium, tantalum, tungsten, molybdenum, tantalum nitride, TiN, WN, TiAl, LAIN, TaCN, TaC, TaSiN, metal alloys, other suitable materials, and/or combinations thereof. In some embodiments, heavily doped amorphous silicon or polysilicon is alternatively used. In that case a highly concentrated dopant such as boron or phosphorus is utilized to form gate electrode 17. In some embodiments, a silicon layer is used as gate material for gate structure 15. A silicide layer (not shown) is formed on gate electrode layer 17 by reacting silicon with conductive material such as tungsten, Ti, Pt, Ta, Nb, Hf, Mo, or other suitable metal.

Gate structure 15 has a first sidewall spacer 18 of gate structure 15 and a second sidewall spacer 19 disposed opposite to first sidewall spacer 18 of gate structure 15. First sidewall spacer 18 and second sidewall spacer 19 are formed by dielectric material such as silicon nitride or silicon oxide. First sidewall space 18 and second sidewall spacer 19 may be formed in different shapes in the upper portions or slopes. First sidewall spacer 18 and second sidewall spacer 19 may be formed by deposition of thin film, such as silicon nitride, on gate structure 15 and semiconductor substrate 12. Then an etching process is used to remove the residue film material on the surface of semiconductor substrate 12, leaving first sidewall spacer 18 and second sidewall 19.

Referring to FIG. 1B, ILD layer 104 further comprises conductive plugs 21 and conductive plug 22. Conductive plug 21 may be formed atop first doped region 13. Conductive plug 21 is electrically coupling first doped region 13 with conductive materials of overlying layers in semiconductor device 100. Similarly, conductive plug 22 is electrically coupling second doped region 14 with conductive materials of overlying layers in semiconductor device 100. Conductive plugs 21 and 22 are formed with electrically conductive materials, such as aluminum, copper, tungsten, or other suitable metal. Conductive plugs 21 and 22 may be formed by a suitable process such as low pressure chemical vaporization deposition (LPCVD) or sputtering.

In some embodiments, a diffusion barrier layer (not shown) is formed between conductive plugs 21 and 22 and semiconductor substrate 102. For example, titanium, titanium nitride or tungsten-tungsten can be used in forming the diffusion barrier layer. The diffusion barrier layer may be formed by sputtering, CVD or other suitable process.

ILD 104 also includes dielectric materials for electrically isolating among components in ILD layer 104, and between ILD 104 and semiconductor substrate 102. A suitable process may be utilized for forming the dielectric materials, such as deposition. Then a planarization process is applied to ILD layer 104 for further processes.

Referring to FIG. 1B, a dielectric layer 105 is disposed on ILD layer 104. Dielectric layer 105 includes materials such as silicon oxide, silicon nitride (SiN), silicon oxynitride, silicon oxycarbide (SiOC), silicon carbide, fluorinated silicon oxide (SiOF), carbon-doped silicon oxide (e.g., SiOCH), spin-on glass (SOG), amorphous fluorinated carbon, fluorinated silica glass (FSG), polyimide, BCB (bis-benzocyclobutenes), non-porous materials, porous materials, and/or combinations thereof. In some embodiments, Dielectric layer 105 includes a high density plasma (HDP) dielectric material (e.g., HDP oxide) and/or a high aspect ratio process (HARP) dielectric material (e.g., HARP oxide). In some embodiments, Dielectric layer 105 is a planarized dielectric film.

Dielectric layer 105 is formed by a suitable deposition process, which may include chemical vapor deposition (CVD), physical vapor deposition (PVD), ionized PVD (IPVD) and atomic layer deposition (ALD). Additionally, other processes include high density plasma CVD (HDPCVD), metal organic CVD (MOCVD), remote plasma CVD (RPCVD), plasma enhanced CVD (PECVD), LPCVD, thermal oxidation, UV-ozone oxidation, epitaxial growth methods (e.g., selective epitaxy growth), sputtering, plating, spin-on coating, other suitable methods, and/or combinations thereof. In an embodiment, dielectric layer 105 has a suitable range of thickness from about 100 Å to about 2000 Å.

Figure 1C:
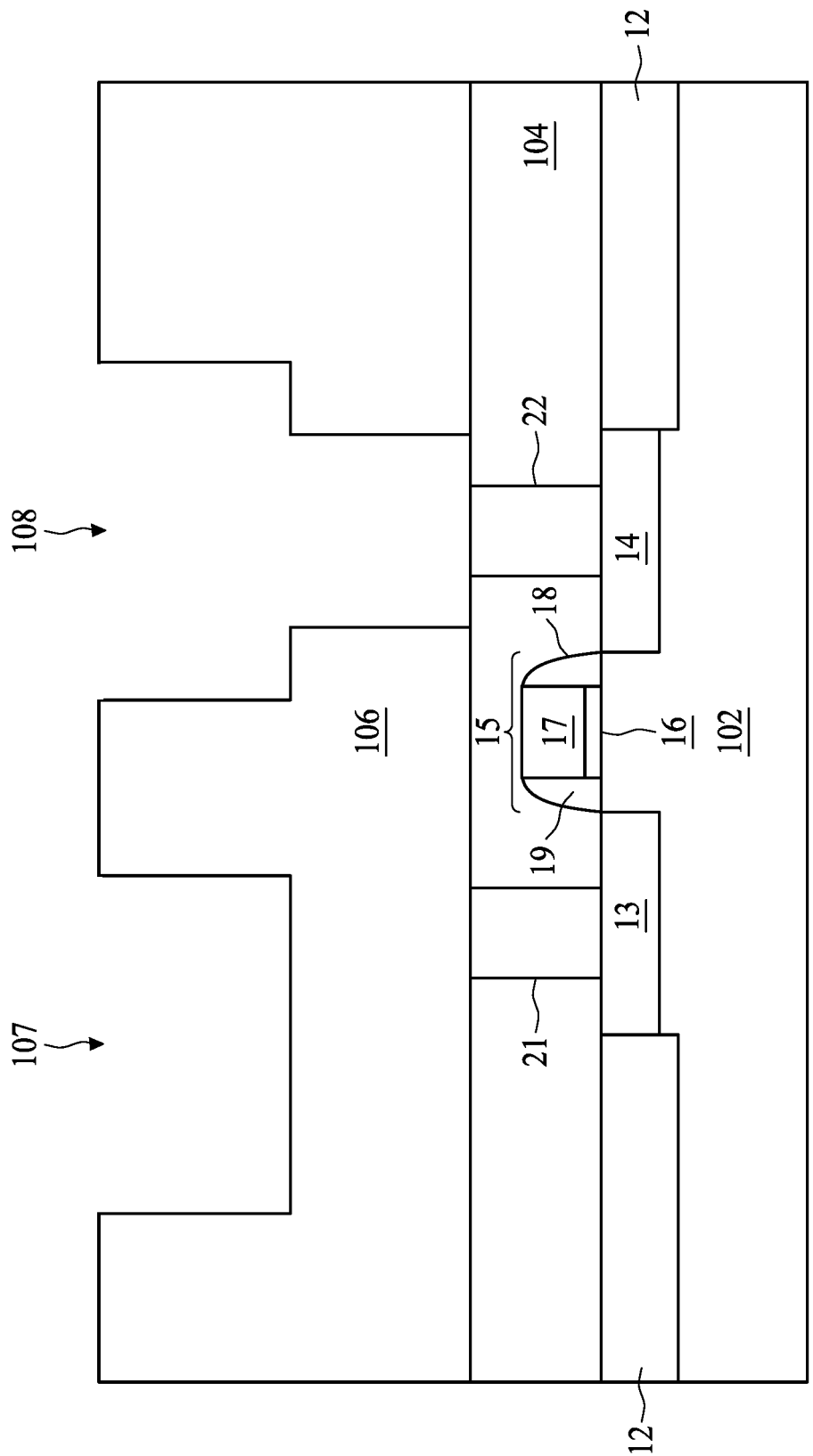

In FIG. 1C, a trench 107 and a recess 108 are formed by a suitable etching process on dielectric layer 105 to form patterned dielectric layer 106. Recess 108 may include a stacked trench and via structure. In some embodiments, a layer of photoresist is formed over dielectric layer 105 by a suitable process, for example, lithography or other alternatives, and patterned to form a photoresist feature by a proper photolithography patterning method. A photolithography process may also be implemented or replaced by other proper methods such as maskless photolithography, electron-beam writing, ion-beam writing, and/or molecular imprint. In some embodiments, a photolithography process may include forming a photoresist layer over dielectric layer 105, exposing photoresist to a pattern, performing a post-exposure bake process, and forming a masking element including the photoresist. In an embodiment, a dual damascene technology is utilized where an intermediate etch stop layer may be formed as hard mask for the stacked trench-via structure of recess 108.

Subsequently, trench 107 and recess 108 may then be etched using reactive ion etching (RIE) processes and/or other etching processes. An etching process may include dry etching, wet etching, and/or other etching methods (e.g., reactive ion etching). The etching process may also be either purely chemical (plasma etching), purely physical (ion milling), and/or combinations thereof.

A dry etching process may be implemented in an etching chamber. The thickness of different features may be controlled by adjusting some process parameters including a radio frequency (RF) source power, a bias power, electrode size, a pressure, a flow rate, etching duration, a wafer temperature, other suitable process parameters, and/or combinations thereof. A dry etching process may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr, He and/or $CHBr_3$), iodine-containing gas, other suitable gases and/or plasmas, and/or combinations thereof. In some embodiments, the dry etching process utilizes an $O_2$ plasma treatment and/or an $O_2/N_2$ plasma treatment. Further, the dry etching process may be performed for a suitable duration.

A wet etching process may utilize a hydrofluoric acid (HF) solution for a HF dipping process. In some embodiments, a wet etching process may apply a diluted hydrofluoric acid to an intermediate semiconductor structure. In some embodiments, the wet etching process includes exposing to a hydroxide solution containing ammonium hydroxide, diluted HF, deionized water, and/or other suitable etchant solutions.

After trench 107 and recess 108 are formed on patterned dielectric layer 106, the photoresist may be stripped thereafter. Subsequently, a diffusion barrier layer (not shown) may be optionally formed on the bottom and sidewalls of trench 107 and recess 108. A typical diffusion barrier metal or alloy includes tantalum, nickel, hafnium, niobium, zirconium, vanadium, tungsten, nichrome, and titanium tungsten. In addition, conductive ceramics is also considered, such as indium oxide, copper silicide, tungsten nitride, and titanium nitride. A suitable deposition process for forming the diffusion barrier layer as previously discussed can be used, such as CVD, ALD and PVD. The diffusion barrier layer has a thickness from about 20 Å to about 200 Å. It is understood, however, that the dimensions recited throughout the present disclosure will scale due to the utilized manufacturing techniques.

Figure 1D:
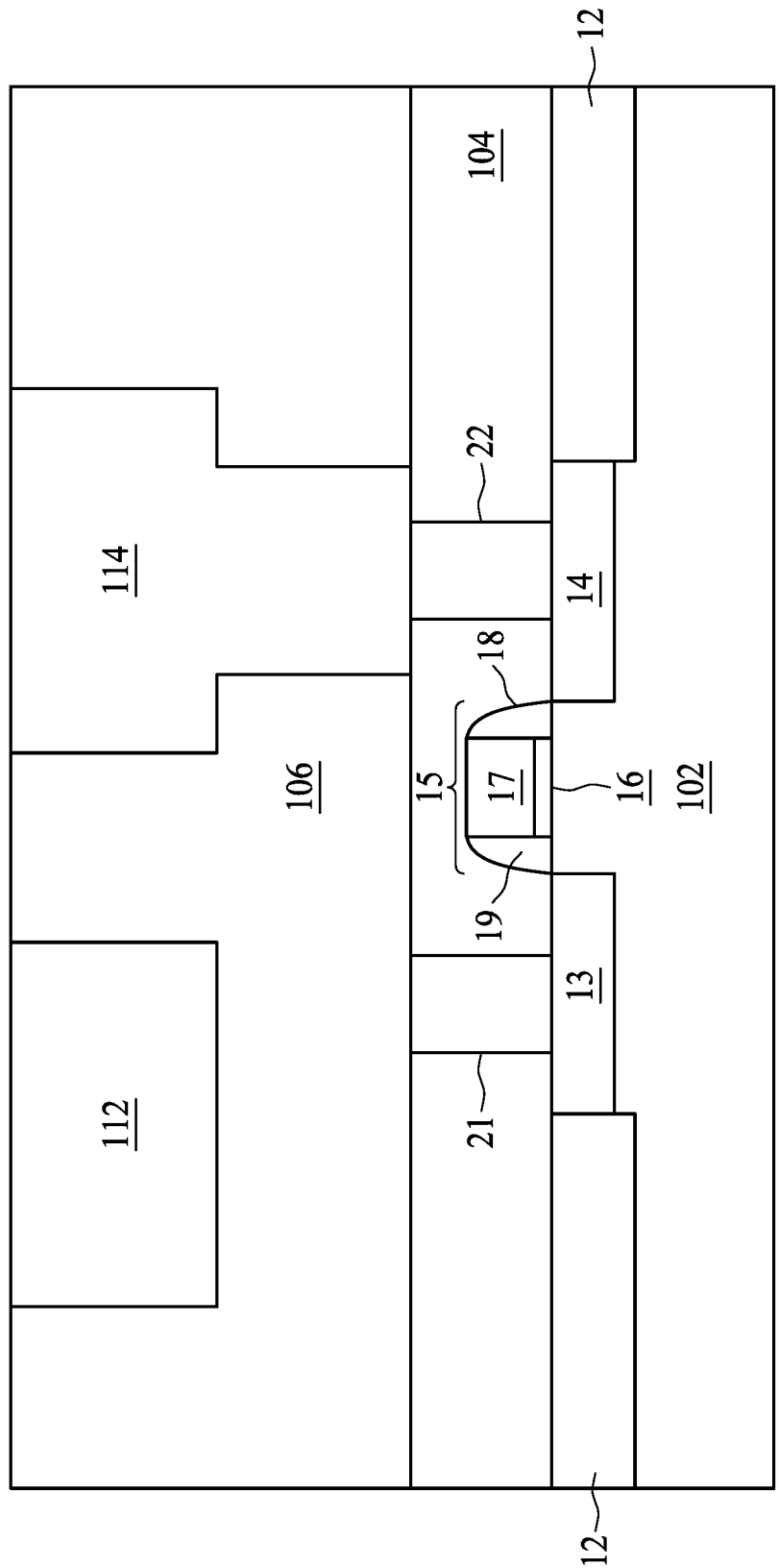

FIG. 1D is a step of filling conductive material into trench 107 and recess 108. A conductive interconnect 112 and a conductive interconnect 114 are then formed in trench 107 and recess 108, respectively. Conductive interconnect 112 is formed to electrically couple features in patterned dielectric layer 106. Similarly, conductive interconnect 114 is formed in recess 108 to electrically connect underlying layers. In some embodiments, conductive interconnect 112 and conductive interconnect 114 are configured to couple gate structure 15 with an input/output (I/O) region (not shown) over conductive interconnect 112 and conductive interconnect 114. The conductive material for conductive interconnect 112 and conductive interconnect 114 includes copper, aluminum or other suitable materials.

In an embodiment, before the formation of conductive interconnects 112 and conductive interconnect 114, a seed layer is optionally formed on the walls of trench 107 and recess 108. Typical materials for the seed layer include Pd or other compounds of polymers and organic materials. The seed layer may be formed by deposition through a suitable process such as PVD.

After conductive interconnects 112 and 114 are formed, a suitable planarization process is used. In some embodiments, patterned dielectric layer 106, and conductive interconnects 112 and 114 are planarized. Additionally, dielectric layer 106, conductive interconnects 112 and 114 are made coplanar to facilitate subsequent processes. A planarization process may be a chemical mechanical planarization (CMP) operation.

Figure 1E:
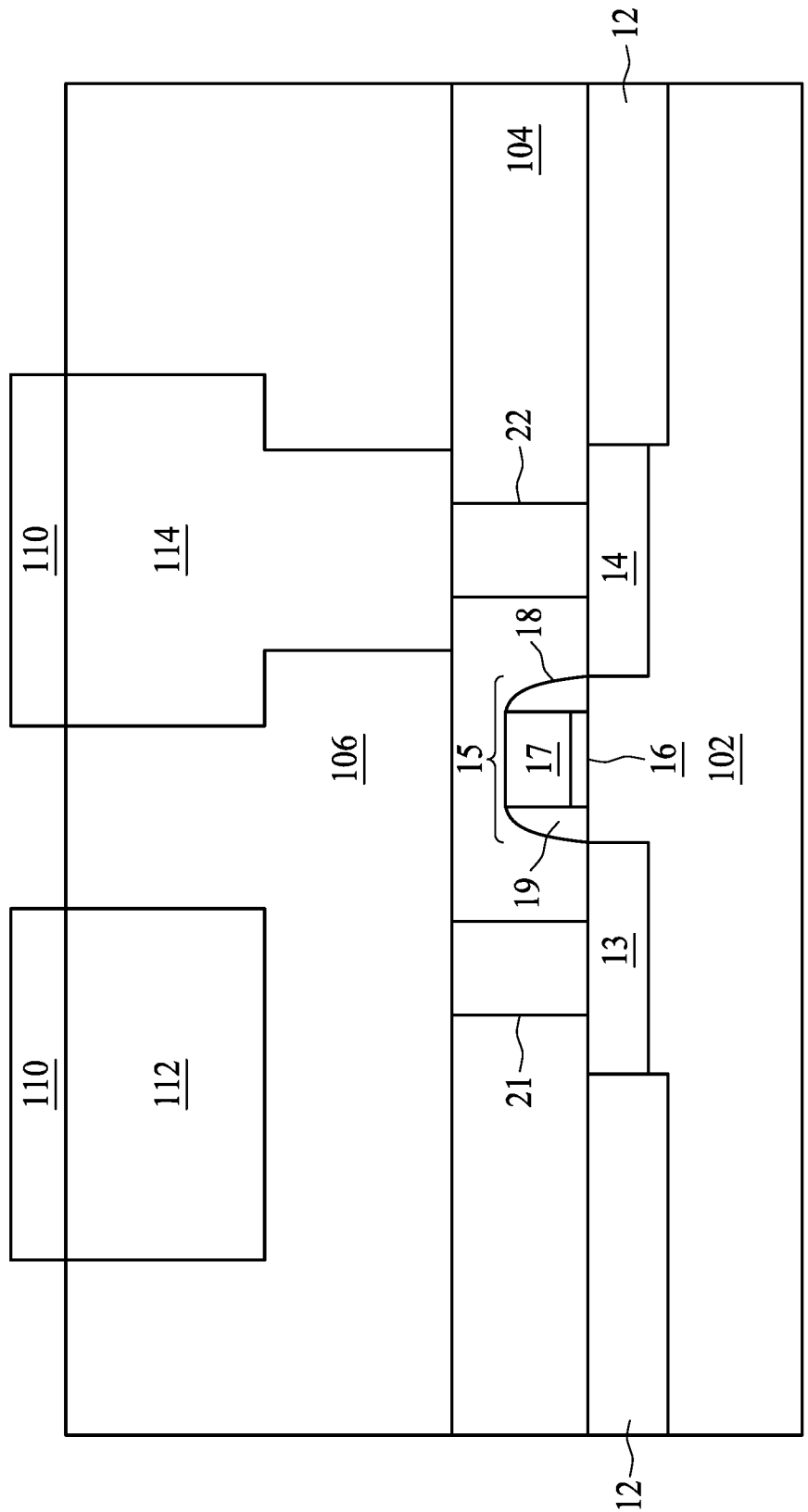

Referring to FIG. 1E, a conductive layer 110 is deposited on conductive interconnect 112 and conductive interconnect 114. In some embodiments, conductive layer 110 is formed between conductive interconnects 112 or 114 and overlying layers, such as dielectric layers. Conductive layer 110 is used to prevent conductive material in conductive interconnect 112 and conductive interconnect 114, such as copper, from diffusing into surrounding dielectric materials. Conductive layer 110 is formed with conductive materials such as cobalt, nickel, tungsten, molybdenum, titanium, platinum tantalum, other suitable material, and/or combinations thereof.

Conductive layer 110 has a thickness from about 10 Å to about 100 Å. A suitable deposition process for forming conductive layer 110 includes CVD, ALD and other suitable processes. In some embodiments, a deposition process may perform selective deposition of conductive layer 110 onto the surface of the openings of conductive interconnect 112 and conductive interconnect 114 in order for electrically insulating between conductive interconnect 112 and conductive interconnect 114. Also, the selective deposition provides to insulate conductive interconnect 112 and conductive interconnect 114 and other conductive interconnects in patterned dielectric layer 106.

Figure 1F:
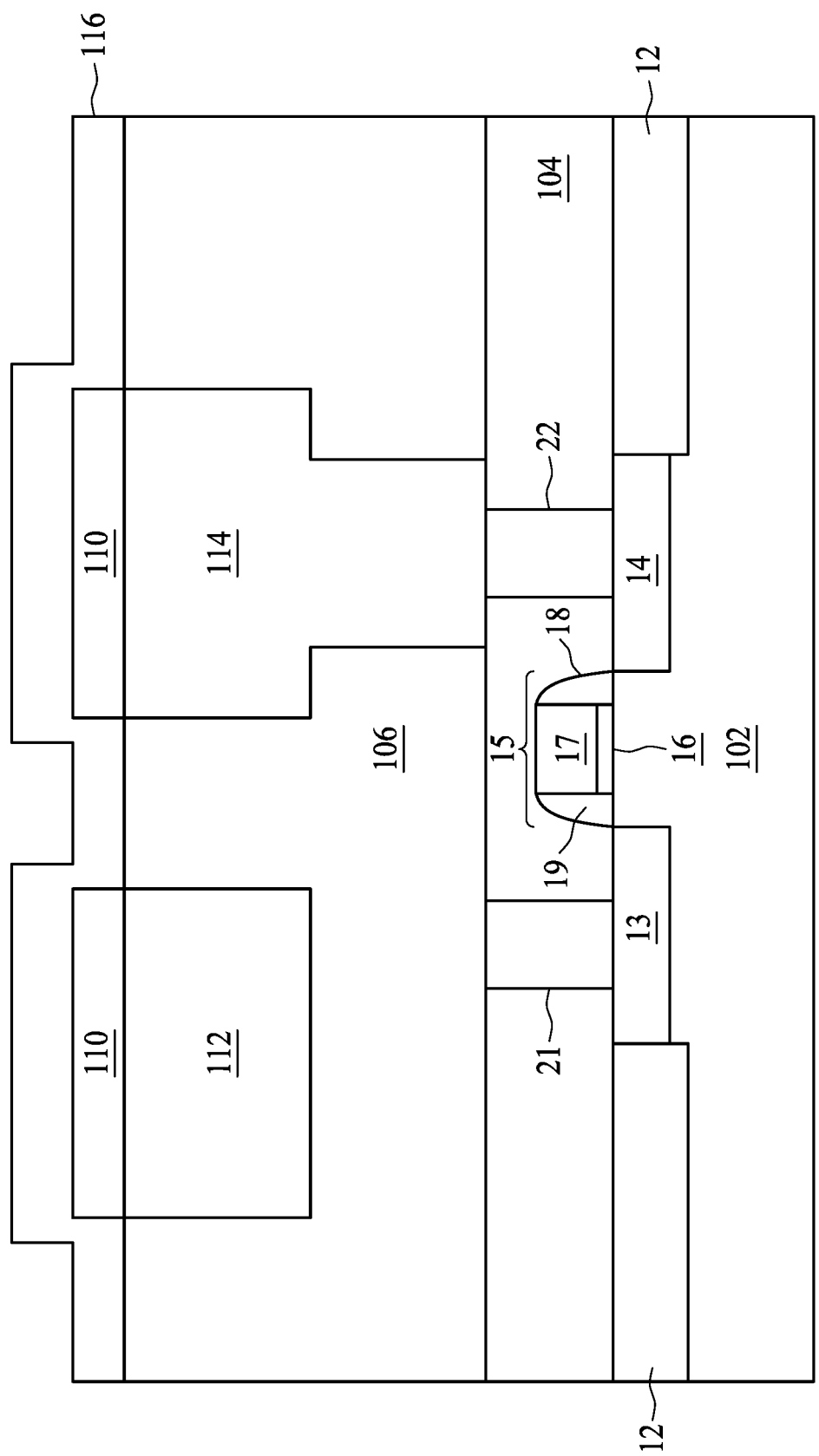

Referring to FIG. 1F, a silicon layer 116 is deposited over conductive layer 110, In one embodiment, silicon layer 116 is covering patterned dielectric layer 106. Silicon layer 116 has a thickness of from about 10 Å to about 100 Å. A suitable deposition process includes CVD using silane ($SiH_4$) or disilane ($Si_2H_6$) as a silicon precursor. Alternatively, silicon layer 116 can be formed by a PVD process by using silicon as target.

Figure 1G:
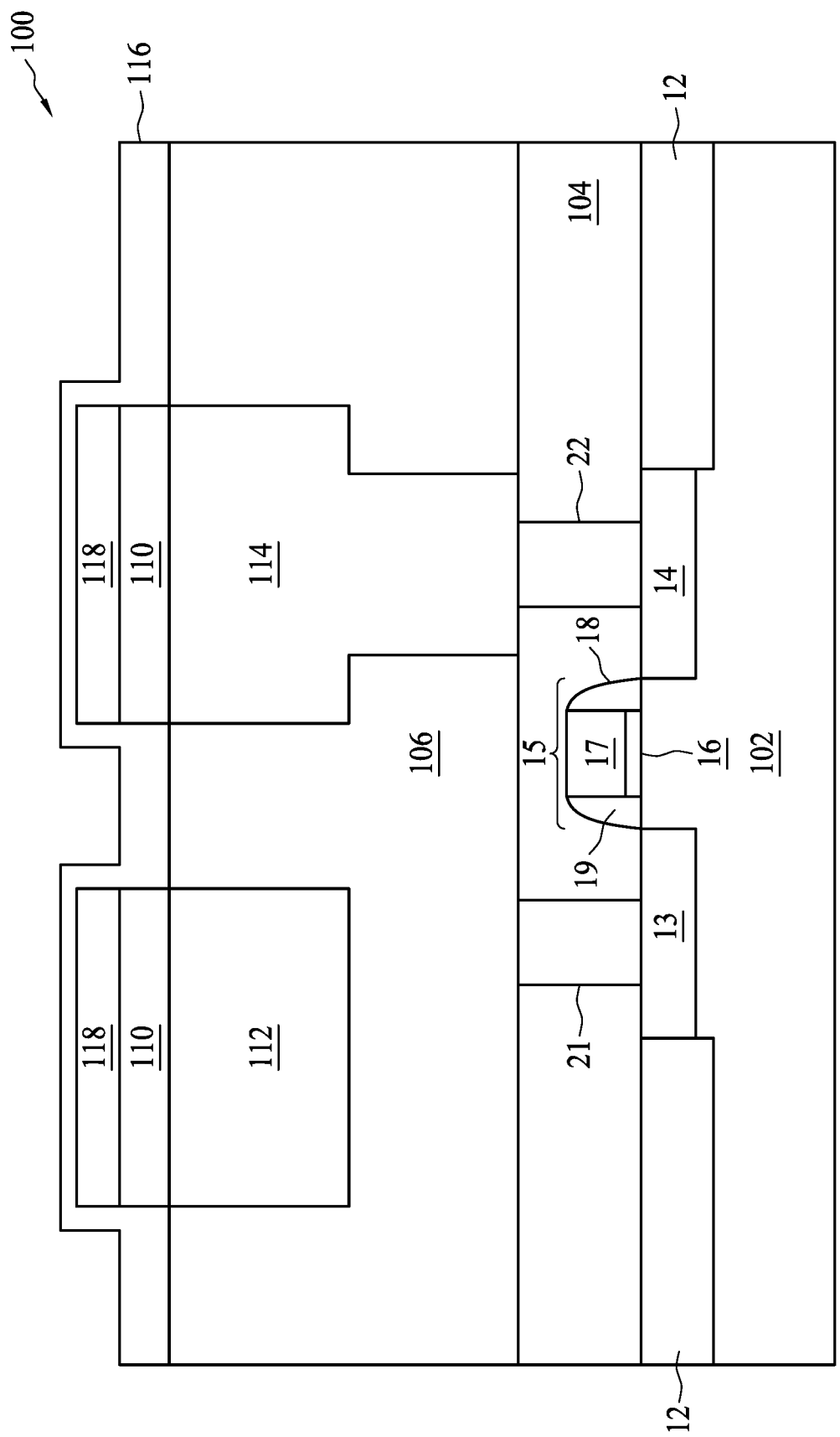

Referring to FIG. 1G, a metal silicide layer 118 is formed at the interface of silicon layer 116 and conductive layer 110. In an embodiment, silicon layer 116 is disposed on the periphery of metal silicide layer 118. Silicon layer 116 provides silicon for forming metal silicide layer 118. Metal silicide layer 118 is formed by reacting silicon atoms from silicon layer 116 with the metal included in conductive layer 110. Metal silicide layer 118 may include $Co_2Si$, CoSi, CoSi$_2$, NiSi, NiSi$_2$, WSi$_2$, MoSi$_2$, TiSi$_2$, PtSi, TaSi$_2$, other suitable materials, and/or combinations thereof.

Metal silicide layer 118 is formed over conductive interconnects 112 and 114. In one embodiment, when the conductive material in contact with conductive layer 110 is consumed in forming metal silicide layer 118, metal silicide layer 118 would be formed on conductive interconnects 112 and 114. In another embodiment where part of conductive layer 110 is disposed on conductive interconnects 112 and 114, metal silicide layer 118 is formed between silicon layer 116 and conductive layer 110. In one embodiment, metal silicide layer 118 is disposed over the surfaces of conductive interconnects 112 and 114.

Figure 1H:
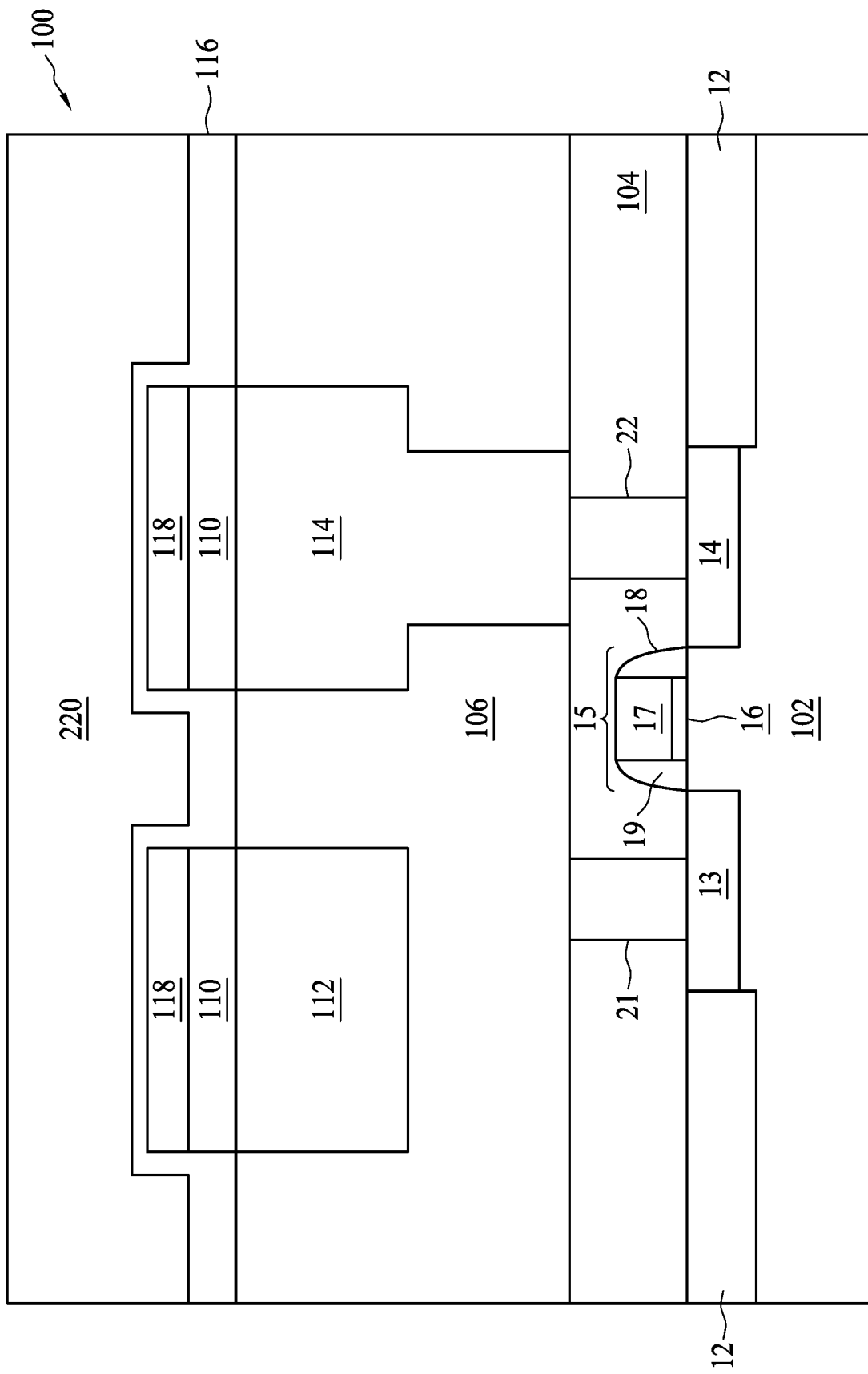

Referring FIG. 1H, a second dielectric layer 220 is formed on metal silicide layer 118. In one embodiment, second dielectric layer 220 is deposited on patterned dielectric layer 106. Second dielectric layer 220 may be deposited on silicon layer 116. In one embodiment, the material used for forming second dielectric layer 220 is the same as that for forming patterned dielectric layer 106. In another embodiment, when both the silicon of silicon layer 116 and the silicon-contacting metal in conductive layer 110 are consumed, metal silicide layer 118 may be formed between second dielectric layer 220 and conductive interconnects 112 and 114. Second dielectric layer 220 has a thickness of from about 100 Å to about 2000 Å. In one embodiment, the ratio of thickness between second dielectric layer 220 and metal silicide layer 118 is between 1 and 200.

In an embodiment, the step of forming metal silicide layer 118 to be a silicide form of the conductive material of conductive layer 110 is performed during the formation of the second dielectric layer 220 on silicon layer 116.

In an embodiment, silicon layer 116 has a coefficient of thermal expansion (CTE) of from about 2 ppm/° C. to about 3.3 ppm/° C., for example 2.6 ppm/° C. In another embodiment, second dielectric layer 220 has a CTE of from about 0.1 ppm/° C. to about 5 ppm/° C., for example 1 ppm/° C. In some embodiments, conductive layer 110 has a CTE of from about 4.5 ppm/° C. to about 9 ppm/° C., for example 6.3 ppm/° C., or from about 13 ppm/° C. to about 14 ppm/° C., for example 13.5 ppm/° C. In an embodiment, conductive interconnects 112 or 114 has a CTE of from about 16 ppm/° C. to about 24 ppm/° C. In an embodiment, metal silicide layer 118 has a CTE of from about 6.5 ppm/° C. to about 9.5 ppm/° C., or from about 9.5 ppm/° C. to about 15 ppm/° C.

In some examples, the CTE of conductive interconnect 112 or conductive interconnect 114 is larger than the CTE of metal silicide layer 118. In some examples, the CTE of metal silicide layer 118 is larger than the CTE of silicon layer 116. In some examples, the CTE of metal silicide layer 118 is larger than the CTE of second dielectric layer 220. In some examples, the CTE of metal silicide layer 118 is larger than the CTE of patterned dielectric layer 106.

In some examples, the ratio of the CTE between metal silicide layer 118 and second dielectric layer 220 is larger than the ratio of CTE between metal silicide layer 118 and silicon layer 116. In some examples, the ratio of the CTE between conductive interconnect 112 and second dielectric layer 220 is larger than the ratio of CTE between conductive interconnect 112 and silicon layer 116.

In one embodiment, metal silicide layer 118 can be formed in-situ with second dielectric layer 220. In other words, the formation of both metal silicide layer 118 and second dielectric layer 220 can be performed within the same chamber or within one platform without breaking vacuum. Alternatively, second dielectric layer 220 is formed in one chamber by breaking vacuum after metal silicide layer 118 is formed in another chamber.

In conventional practices, it is required to form conductive layer 110 and second dielectric layer 220 in different chambers, and thus a process sequence with breaking vacuum is inevitable. When conductive layer 110 is formed and moved out of the vacuum condition, it is found that a metal oxide layer may be formed before second dielectric layer 220 is formed on conductive layer 110. The metal oxide layer is formed by reacting oxygen in the atmosphere with conductive layer 110. It is believed that the metal oxide layer may lead to defects such as bubbles or peeling. The adhesion between conductive layer 110 and second dielectric layer 220 is thus degraded. The device integrity and reliability would be impacted due to peeling or bubbles. On the contrary, in the present disclosure, silicon layer 116 is formed on conductive layer 110 before conductive layer 110 is exposed to oxygen. That can prevent formation of a metal oxide layer. The performance of adhesion between conductive layer 110 and second dielectric layer 220 is thus improved.

Figure 1I:
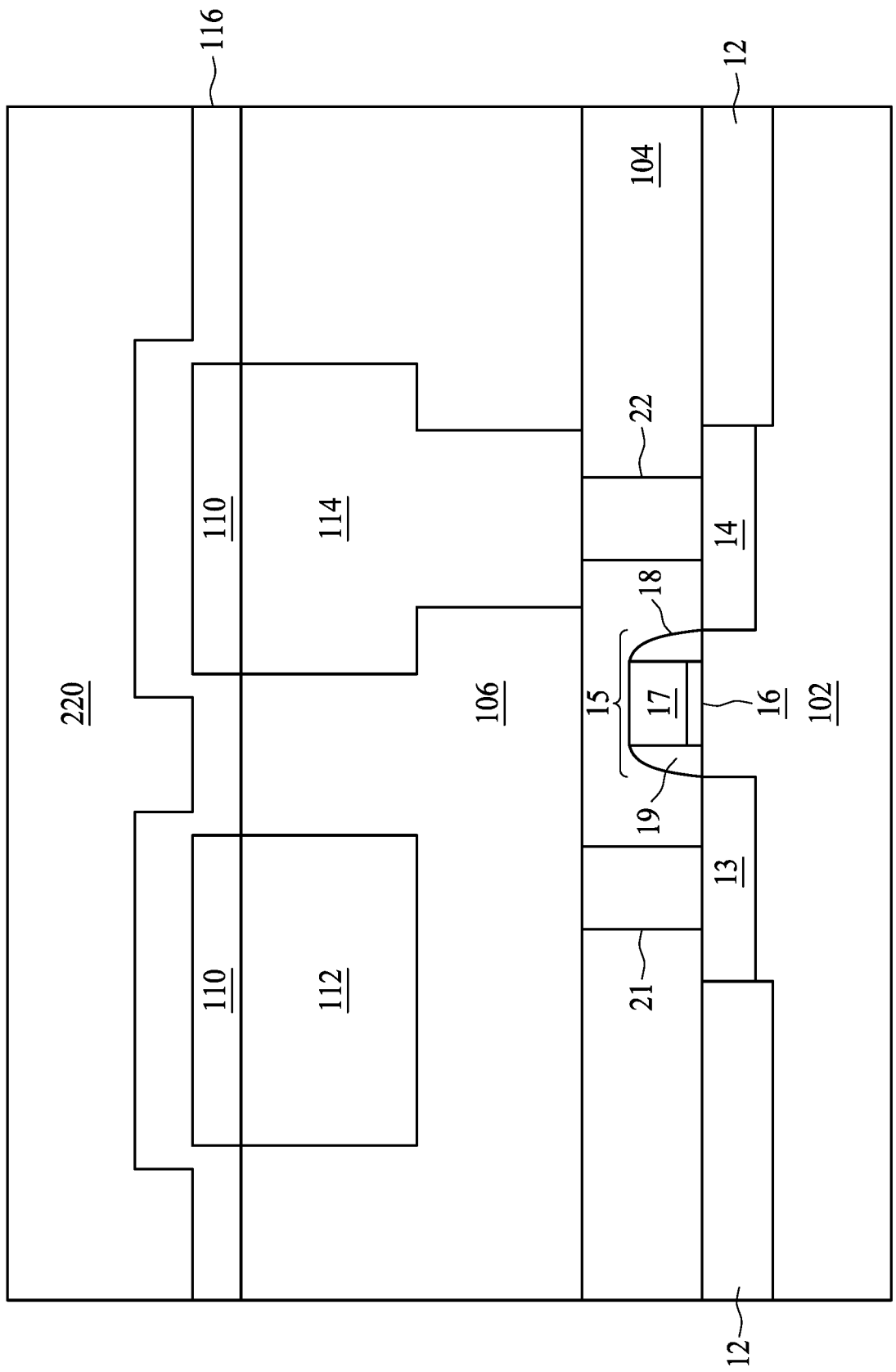
Figure 1J:
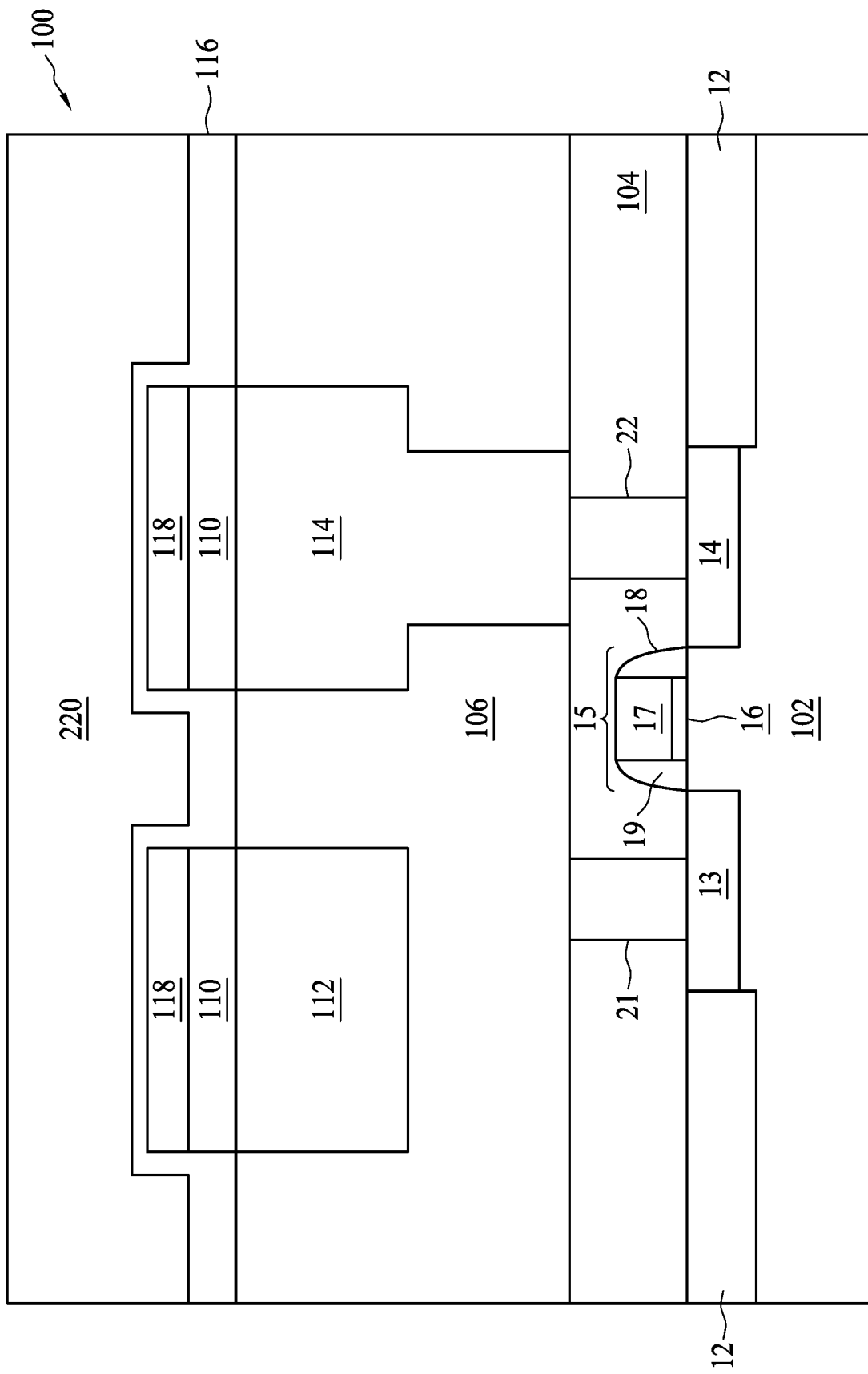

FIGS. 1I-1J are cross sectional views of a semiconductor device manufacturing processes, in accordance with some embodiments. FIGS. 1I-1J show alternative operation steps subsequent to the operation step illustrated in FIG. 1F. Referring to FIG. 1I, second dielectric layer 220 is deposited on silicon layer 116 before metal silicide layer 118 is formed. In an embodiment, second dielectric layer 220 is covering part of patterned dielectric layer 106. In another embodiment, silicon layer 116 is disposed between patterned dielectric layer 106 and second dielectric layer 220. Additionally, second dielectric layer 220 is disposed over conductive layer 110. In one embodiment, conductive layer 110 is disposed between pattern dielectric layer 106 and second dielectric layer 220.

Referring to FIG. 1J, metal silicide layer 118 is formed between second dielectric layer 220 and conductive interconnect 114 or conductive interconnect 112. In some embodiments, a suitable process for forming metal silicide layer 118 includes an annealing process, such as heating semiconductor substrate 102.

In one embodiment, metal silicide layer 118 is formed on conductive layer 110. In another embodiment, metal silicide layer 118 is formed at the surface between silicon layer 116 and conductive layer 110. In yet another embodiment, metal silicide layer 118 is formed between silicon layer 116 and conductive interconnect 112 and conductive interconnect 114.

Figure 1K:
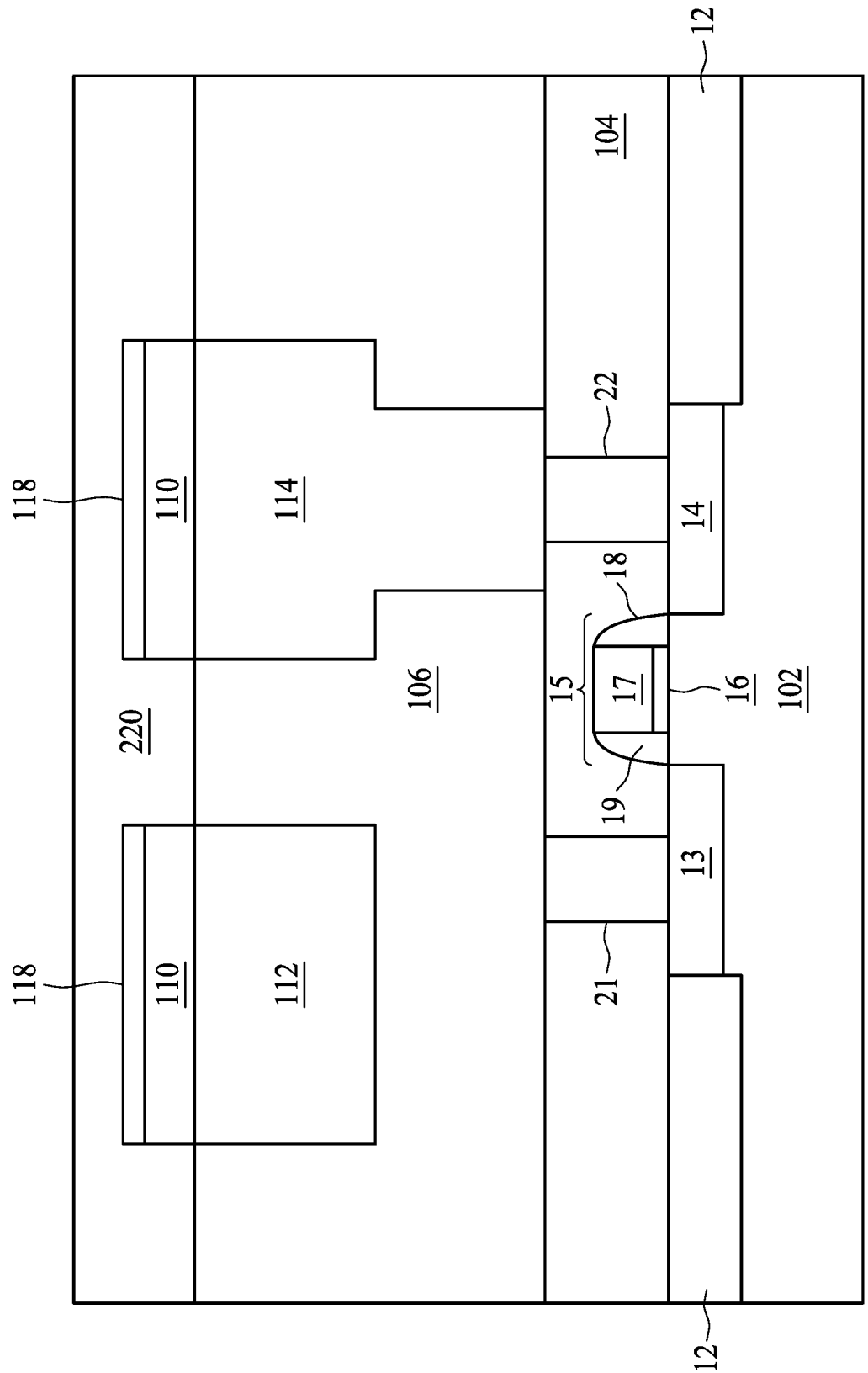
Figure 1L:
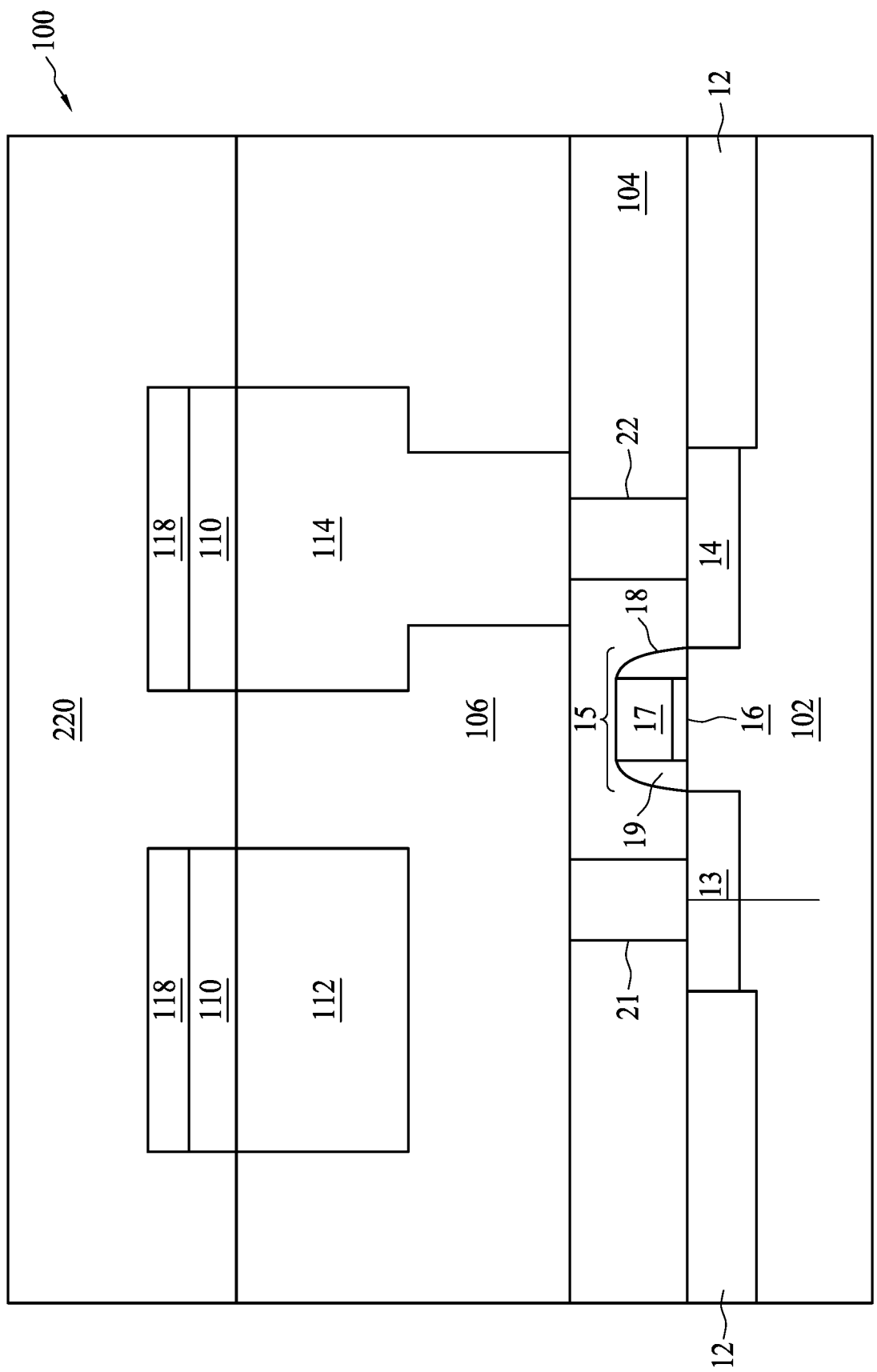

FIGS. 1K-1L are cross sectional views of a semiconductor device manufacturing processes, in accordance with some embodiments. FIGS. 1K-1L show another alternative operation steps subsequent to the operation step illustrated in FIG. 1E. Referring to FIG. 1K, part of second dielectric layer 220 is formed on patterned dielectric layer 106. In that case second dielectric layer 220 is utilized, instead of the formation of silicon layer 116 as illustrated in FIG. 1F, with a view to keeping oxygen from reacting with metal in conductive layer 110. In an embodiment, second dielectric layer 220 is covering portions of patterned dielectric layer 106. Second dielectric layer 220 is disposed over conductive layer 110. In another embodiment, conductive layer 110 is disposed between patterned dielectric layer 106 and second dielectric layer 220.

During operation illustrated in FIG. 1K where part of second dielectric layer 220 is formed, the formation of metal silicide layer 118 is also started on the surface of conductive layer 110. With second dielectric layer 220, the silicon in second dielectric layer 220 is transferred into metal silicide layer 118 during the formation of second dielectric layer 220. In one embodiment, metal silicide layer 118 is formed between second dielectric layer 220 and conductive layer 110.

Referring to FIGS. 1E, and 1K, second dielectric layer 220 and metal silicide layer 118 are formed in-situ with conductive layer 110 without breaking vacuum. In addition, the step of forming metal silicide layer 118 to be a silicide form of the conductive material of conductive layer 110 is performed during the formation of second dielectric layer 220.

Referring to FIG. 1L, a full second dielectric layer 220 and a full metal silicide layer 118 are formed.

Figure 2:
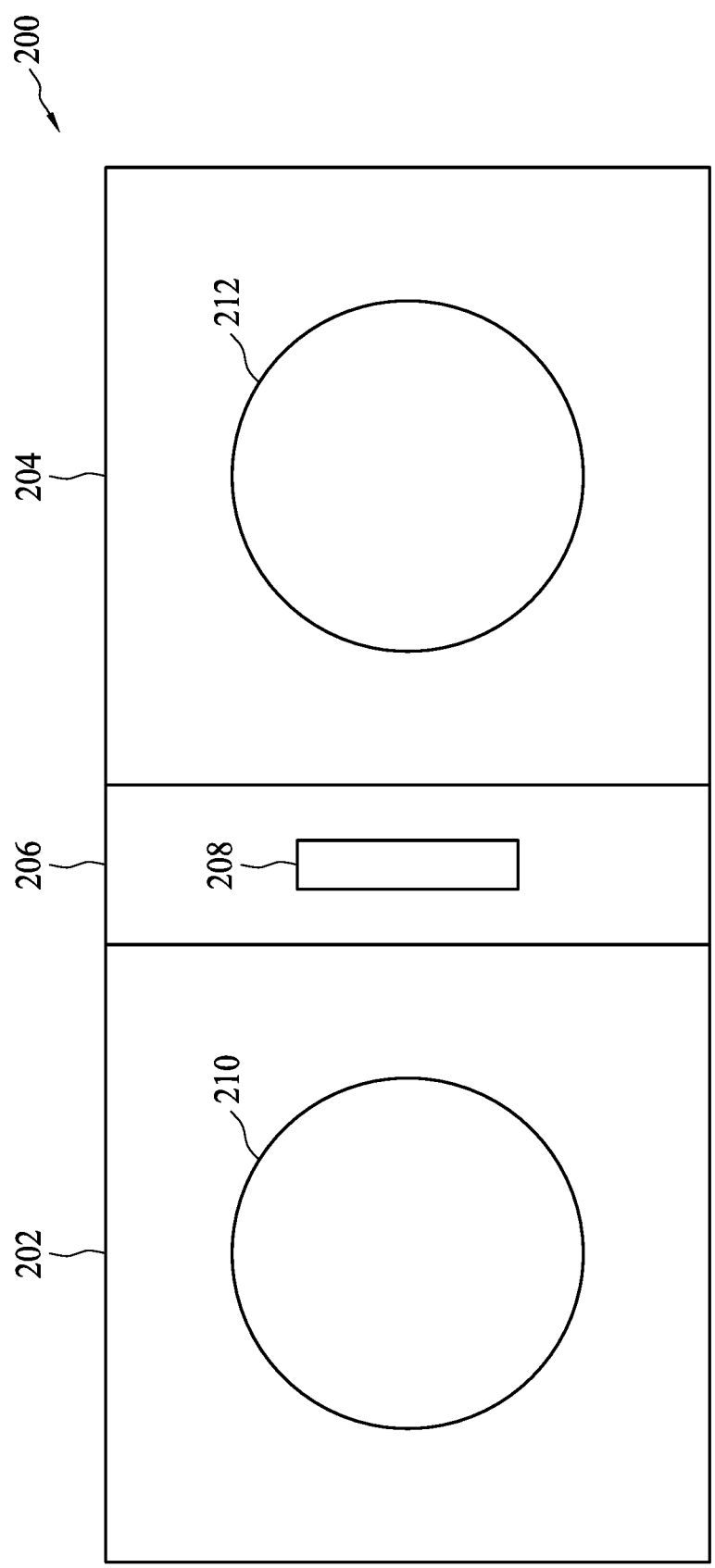
FIG. 2 is a schematic showing a semiconductor manufacturing platform, in accordance with some embodiments of the present disclosure.

FIG. 2 shows a schematic of a semiconductor manufacturing platform 200, in accordance with some embodiments. Semiconductor manufacturing platform 200 includes a first tool 202, a second tool 204, and a channel 206.

First tool 202 includes a first chamber 202 to accommodate a semiconductor wafer for conducting processes. First tool 202 is configured to perform semiconductor manufacturing operations, such as those illustrated in FIGS. 1A-1L, on the semiconductor wafer. First chamber 202 is shown for illustration, and different configurations with more chambers are alternatively used in first tool 202. Similarly, second tool 204 includes a second chamber 204 to accommodate a semiconductor wafer. In one embodiment, a manufacturing process performed in first tool 202 may be different from the manufacturing process performed in second tool 204.

Channel 206 is disposed between first tool 202 and second tool 204. Channel 206 includes a robot 208, configured to move semiconductor wafers between first tool 202 and second tool 204. In one embodiment, channel 206 is configured under a low pressure or vacuum condition. The pressure of channel 206 may be kept under 0.1 torr. When two or more different processes are performed in first tool 202 and second tool 204 in sequence, channel 206 provides a virtual vacuum tunnel through which contamination due to undesired reactants, such as oxygen, can be controlled. For example, the operations in FIGS. 1E and 1K performed in sequence may be conducted in first tool 202 and second tool 204 separately. The sequential operations require a working environment without breaking vacuum in order to prevent the formation of a metal oxide layer on conductive layer 110. In that case channel 206 can be leveraged in moving semiconductor wafer without breaking vacuum after conductive layer 110 is formed.

Figure 3:
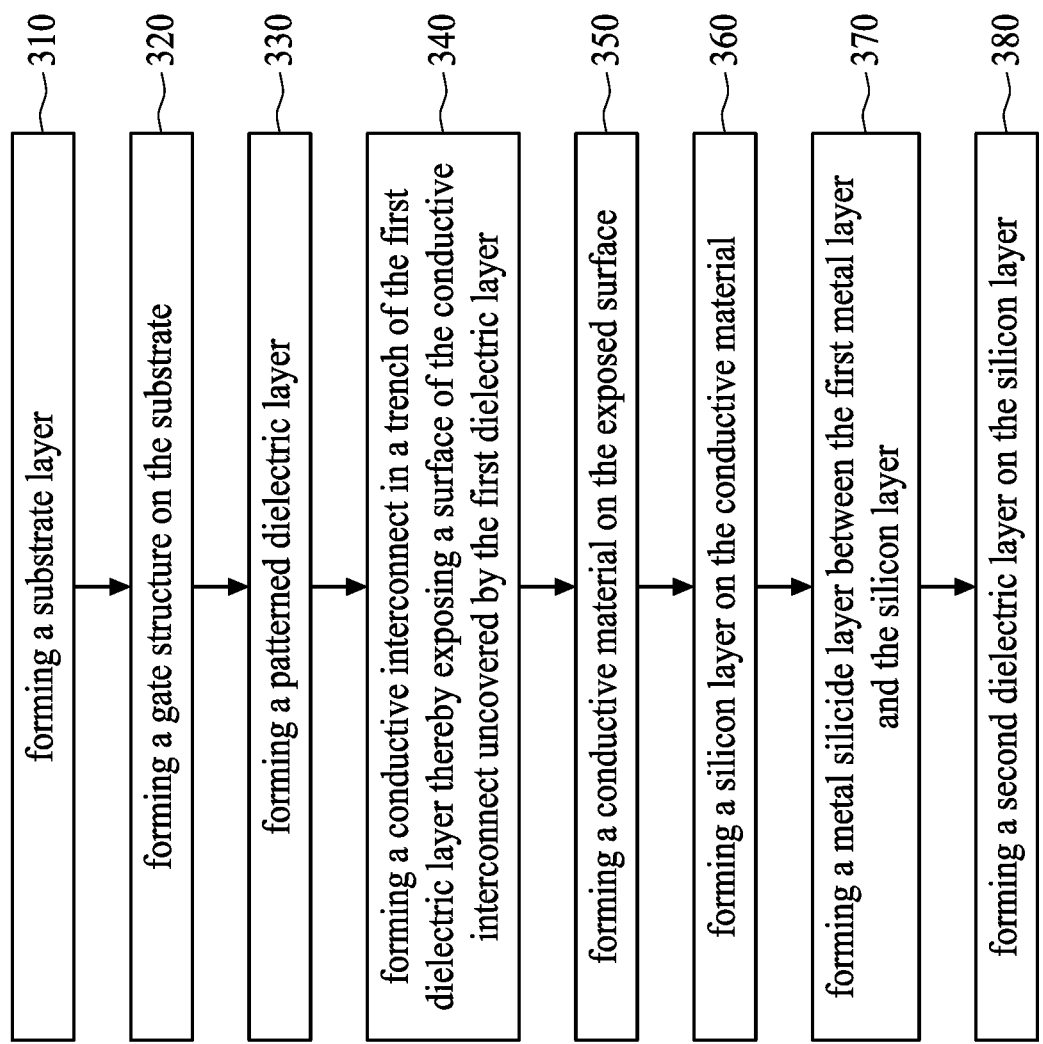
FIG. 3 is a flow diagram showing operations for manufacturing a semiconductor device, in accordance with some embodiments of the present disclosure.

FIG. 3 is a flow diagram showing a semiconductor manufacturing process, in accordance of some embodiments. In operation 310, semiconductor substrate 102 of semiconductor device 100 is provided. In operation 320, at least one transistor is formed on semiconductor substrate 102. The transistor includes a gate structure, a source region and a drain region.

In operation 330, dielectric layer 105 is etched to form trench 107 and recess 108 such that patterned dielectric layer 106 is formed over the gate structure of semiconductor device 100. Subsequently, in operation 340, conductive interconnect 112 and 114 are formed in trench 107 and recess 108, respectively, in patterned dielectric layer 106. A surface of conductive interconnect 112 or conductive interconnect 114 uncovered by the patterned dielectric layer 106 is exposed. In an embodiment, conductive interconnect 112 and conductive interconnect 114 include a conductive material such as copper or aluminum.

In operation 350, conductive layer 110 having a conductive material, such as cobalt, nickel, tungsten, molybdenum, titanium, platinum and tantalum, is formed on the exposed surface of conductive interconnect 112 or conductive interconnect 114. In one embodiment, the conductive material is formed over the exposed surface.

In operation 360, silicon layer 116 is formed on conductive layer 110. Silicon layer 116 provides the silicon for forming metal silicide layer 118. In operation 370, metal silicide layer 118 is formed to be a silicide form of the conductive material for conductive interconnect 112 or conductive interconnect 114. Metal silicide layer 118 is formed by reacting the conductive material with silicon. In an embodiment, metal silicide layer 118 is formed by reacting the conductive material in conductive layer 110 and the silicon through a process of, for example, heating the substrate.

In operation 380, second dielectric layer 220 is formed on silicon layer 116. In one embodiment, second dielectric layer 220 is formed on patterned dielectric layer 106. In an embodiment, the step of forming metal silicide layer 118 to be a silicide form of the conductive material is performed during the formation of second dielectric layer 220 on silicon layer 116.

Figure 4:
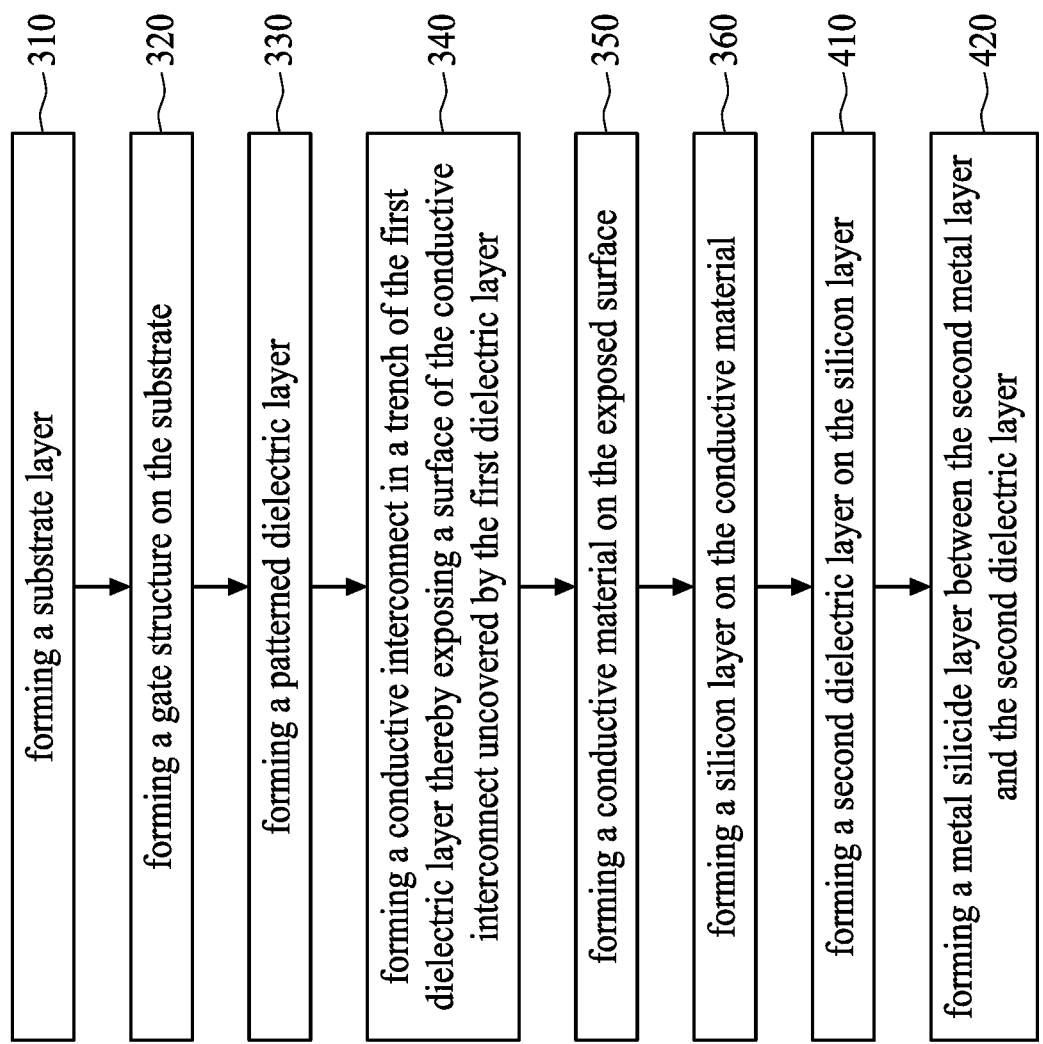
FIG. 4 is a flow diagram showing operations for manufacturing a semiconductor device, in accordance with some embodiments of the present disclosure.

FIG. 4 is a flow diagram showing a semiconductor manufacturing process, in accordance of some embodiments. Referring to FIG. 4, operations 310-360 are illustrated in operations 310-360 of FIG. 3. Following operation 360, in operation 410, second dielectric layer 220 is formed on silicon layer 116. In operation 420, metal silicide layer 118 is formed between conductive layer 110 and second dielectric layer 220.

Figure 5:
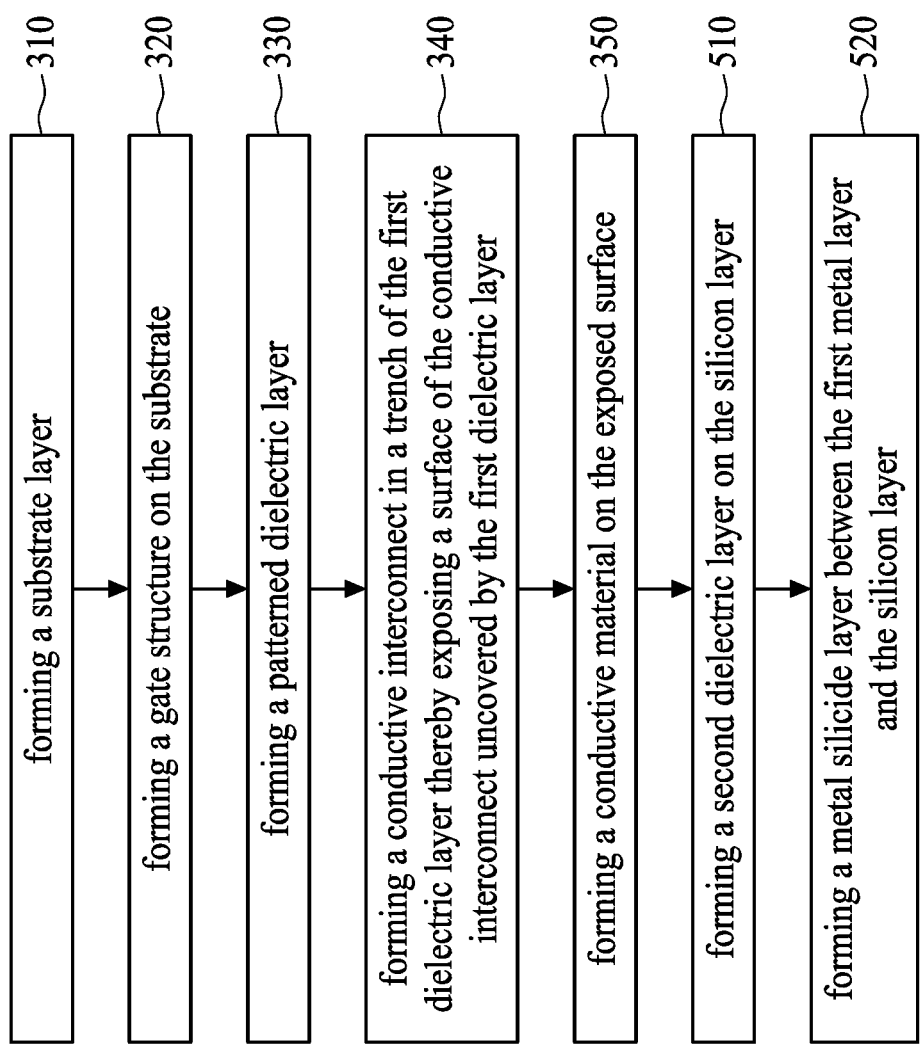
FIG. 5 is a flow diagram showing operations for manufacturing a semiconductor device, in accordance with some embodiments of the present disclosure.

FIG. 5 is a flow diagram showing a semiconductor manufacturing process, in accordance of some embodiment. Referring to FIG. 5, operations 310-350 are illustrated in operations 310-350 of FIG. 3. Following operation 350, in operation 510, part of second dielectric layer 220 is formed on silicon layer 116. In operation 520, metal silicide layer 118 is formed between conductive layer 110 and second dielectric layer 220. Metal silicide layer 118 is formed during the formation of second dielectric layer 220. In an embodiment, metal silicide layer 118 is formed where the silicon is transferred into metal silicide layer 118 during the process of forming second dielectric layer 220 in operation 510.

According to some embodiments of the present disclosure, a method of manufacturing a semiconductor device includes: providing a substrate; forming a gate structure on the substrate; depositing a first dielectric layer over the gate structure; depositing a conductive interconnect in a trench of the first dielectric layer thereby exposing a surface of the conductive interconnect through the first dielectric layer; depositing a conductive layer over the exposed surface of the conductive interconnect; depositing a silicon-containing layer over the conductive layer and the conductive interconnect; and forming a metal silicide layer to be a silicide form of the conductive layer by reacting the conductive layer with silicon in the silicon-containing layer.

According to some embodiments of the present disclosure, a method of manufacturing a semiconductor device includes: providing a substrate; forming a gate structure on the substrate; depositing a first dielectric layer over the gate structure; in a vacuum environment, depositing a conductive interconnect in a trench of the first dielectric layer thereby exposing a surface of the conductive interconnect uncovered by the first dielectric layer; depositing a conductive layer over the exposed surface of the conductive interconnect; and forming a metal silicide layer to be a silicide form of the conductive layer by reacting a metallic material of the conductive layer with silicon. The conductive layer and the metal silicide layer are formed without breaking vacuum.

According to some embodiments of the present disclosure, a method of manufacturing a semiconductor device includes: providing a substrate; forming a gate structure on the substrate; depositing a first dielectric layer over the gate structure; in a chamber, depositing a conductive interconnect in the first dielectric layer, wherein the conductive interconnect comprises a top surface level with an upper surface of the conductive interconnect; depositing a conductive layer covering an entirety of the top surface of the conductive interconnect with the chamber keeping vacuum; forming a metal silicide layer to be a silicide form of the conductive layer with the chamber keeping vacuum; and depositing a second dielectric layer over the metal silicide layer and the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   providing a substrate;
   forming a gate structure on the substrate;
   depositing a first dielectric layer over the gate structure;
   depositing a conductive interconnect in a trench of the first dielectric layer thereby exposing a surface of the conductive interconnect through the first dielectric layer, wherein the conductive interconnect comprises a top surface level with an upper surface of the first dielectric layer;
   depositing a conductive layer over the exposed surface of the conductive interconnect;
   depositing a silicon-containing layer over the conductive layer and the conductive interconnect; and
   forming a metal silicide layer to be a silicide form of the conductive layer by reacting the conductive layer with silicon in the silicon-containing layer, wherein the silicon of the metal silicide layer is provided solely by the silicon-containing layer.

2. The method according to claim 1, wherein the forming the metal silicide layer to be the silicide form of the conductive layer comprises heating the substrate.

3. The method according to claim 1, further comprising forming a second dielectric layer over the metal silicide layer.

4. The method according to claim 1, wherein the depositing the silicon-containing layer over the conductive layer and the conductive interconnect comprises forming a silicon layer on the conductive layer, wherein the silicon layer provides the silicon for forming the metal silicide layer.

5. The method according to claim 4, further comprising forming a second dielectric layer on a remaining portion of the silicon layer.

6. The method according to claim 5, wherein the forming the metal silicide layer to be the silicide form of the conductive layer is performed prior to the forming of the second dielectric layer on the silicon layer.

7. The method according to claim 1, wherein the conductive interconnect is formed of a first metal, and the conductive layer is formed of a second metal different from the first metal.

8. The method according to claim 7, wherein the first metal comprises copper, and the second metal is selected from the group composed of cobalt, nickel, tungsten, molybdenum, titanium, platinum tantalum.

9. The method according to claim 1, wherein the forming the conductive layer over the exposed surface of the conductive interconnect comprises causing the conductive layer to be fully covering and in physical contact with the surface of the conductive interconnect.

10. The method according to claim 1, wherein forming the metal silicide layer to be the silicide form of the conductive layer comprises completely consuming the conductive layer and causing the metal silicide layer to be in physical contact with the conductive interconnect.

11. The method according to claim 1, wherein the forming the metal silicide layer to be the silicide form of the conductive layer comprises leaving a portion of the conductive layer unconsumed after the forming of the metal silicide layer.

12. The method according to claim 11, wherein the portion of the unconsumed conductive layer separates the conductive interconnect from the metal silicide layer.

13. A method of manufacturing a semiconductor device, comprising:
   providing a substrate;
   forming a gate structure on the substrate;
   depositing a first dielectric layer over the gate structure;
   in a vacuum environment, depositing a conductive interconnect in a trench of the first dielectric layer thereby exposing a surface of the conductive interconnect uncovered by the first dielectric layer, wherein the conductive interconnect comprises a top surface level with an upper surface of the first dielectric layer;
   depositing a conductive layer over the exposed surface of the conductive interconnect;
   forming a silicon-containing layer over the conductive layer; and
   forming a metal silicide layer to be a silicide form of the conductive layer by reacting a metallic material of the conductive layer with silicon solely from the silicon-containing layer,
   wherein the conductive layer and the metal silicide layer are formed without breaking vacuum.

14. The method according to claim 13, wherein the silicon of the silicon-containing layer is partially consumed during the forming of the metal silicide layer.

15. The method according to claim 13, wherein the conductive layer keeps an upper surface of the first dielectric layer exposed.

16. The method according to claim 13, wherein the metal silicide layer covers an entirety of the exposed surface of the conductive interconnect.

17. The method according to claim 13, further comprising forming a second dielectric layer over a remaining portion of the conductive layer subsequent to forming the metal silicide layer.

18. The method according to claim 17, wherein the metal silicide layer is in contact with the second dielectric layer.

19. The method according to claim 13, further comprising breaking vacuum and forming a second dielectric layer over the metal silicide layer and the first dielectric layer after the metal silicide layer is formed.

20. A method of manufacturing a semiconductor device, comprising:
- providing a substrate;
- forming a gate structure on the substrate;
- depositing a first dielectric layer over the gate structure;
- in a first chamber, depositing a conductive interconnect in the first dielectric layer in a vacuum environment, wherein the conductive interconnect comprises a top surface level with an upper surface of the first dielectric layer;
- depositing a conductive layer covering an entirety of the top surface of the conductive interconnect without breaking vacuum of the first chamber;
- depositing a silicon-containing layer over the conductive layer without breaking vacuum of the first chamber;
- forming a metal silicide layer to be a silicide form of the conductive layer, without breaking vacuum of the first chamber, by providing silicon solely from the silicon-containing layer; and
- depositing a second dielectric layer over the metal silicide layer and the first dielectric layer in a second chamber.

* * * * *